(12) United States Patent
Clidaras et al.

(10) Patent No.: US 6,493,230 B2
(45) Date of Patent: Dec. 10, 2002

(54) MODULAR COMPUTER SYSTEM MECHANICAL INTERCONNECTION

(75) Inventors: Jimmy Clidaras, San Jose, CA (US); Kenneth Kitlas, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 22 days.

(21) Appl. No.: 09/846,984

(22) Filed: May 1, 2001

(65) Prior Publication Data

US 2002/0163788 A1 Nov. 7, 2002

(51) Int. Cl.[7] .............................. H05K 7/10; H05K 5/02
(52) U.S. Cl. ....................... 361/730; 361/731; 361/728; 439/928.1; 312/223.2
(58) Field of Search ................................ 361/679–686, 361/724–733, 735, 752, 754, 756, 790, 796–798, 801; 439/928.1, 945, 946, 59, 62; 312/223.2

(56) References Cited

U.S. PATENT DOCUMENTS

| | | | | |
|---|---|---|---|---|
| 4,401,351 A | * | 8/1983 | Record | 361/688 |
| 4,501,460 A | * | 2/1985 | Sisler | 361/683 |
| 4,530,066 A | * | 7/1985 | Ohwaki et al. | 361/685 |
| 4,659,159 A | * | 4/1987 | Takahashi | 361/686 |
| 5,311,397 A | * | 5/1994 | Harshberger et al. | 361/683 |
| 5,440,181 A | * | 8/1995 | Gruender et al. | 307/156 |
| 5,452,180 A | * | 9/1995 | Register et al. | 361/686 |
| 4,558,914 A | * | 12/1995 | Prager et al. | 361/686 |
| 5,645,434 A | * | 7/1997 | Leung | 361/735 |
| 5,825,618 A | * | 10/1998 | Schnoor et al. | 361/683 |

FOREIGN PATENT DOCUMENTS

| | | | | |
|---|---|---|---|---|
| GB | 2350032 A | * | 11/2000 | H04L/12/24 |
| JP | 2000-163168 A | * | 6/2000 | G06F/3/00 |

* cited by examiner

Primary Examiner—Gerald Tolin
Assistant Examiner—Anatoly Vortman
(74) Attorney, Agent, or Firm—Williams, Morgan & Amerson, P.C.

(57) ABSTRACT

A modular computer system mechanical interconnection includes a primary chassis having a first opening and a secondary chassis attached to the primary chassis and having a second opening, wherein the first opening and the second opening are generally aligned. The apparatus further includes a backplate covering the aligned first opening and second opening.

21 Claims, 7 Drawing Sheets

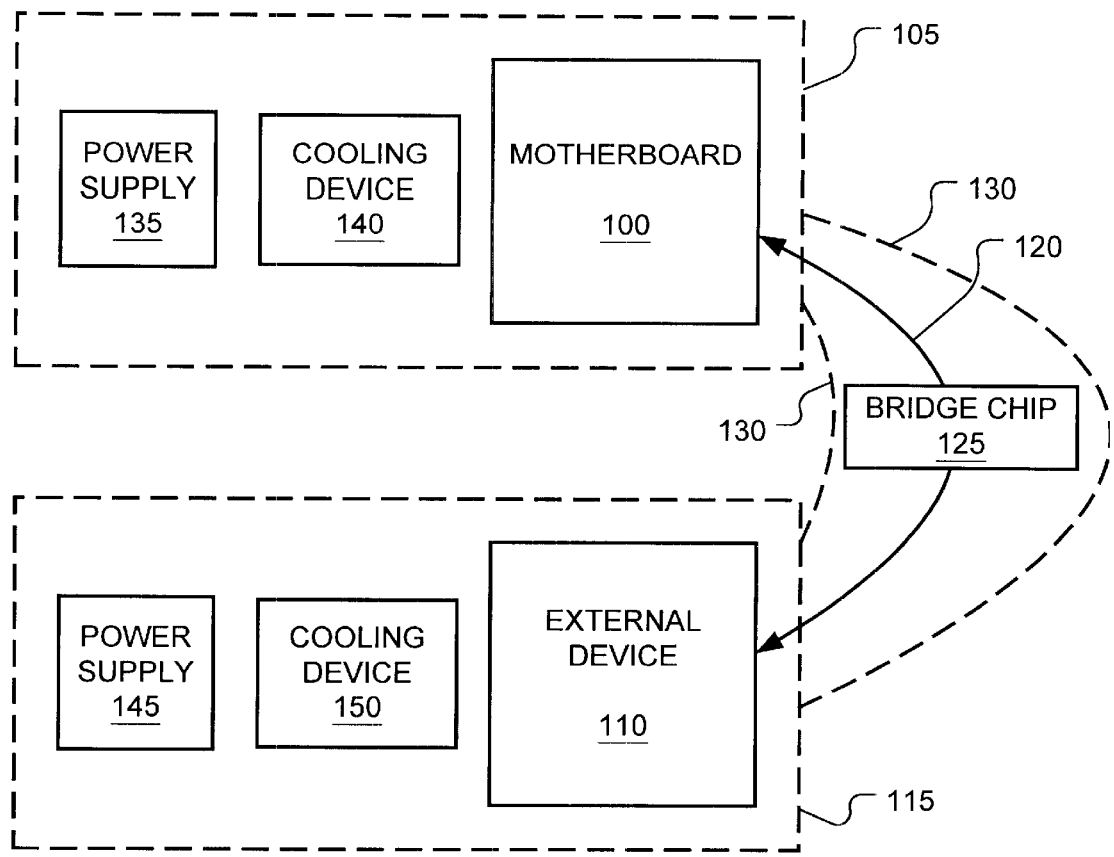
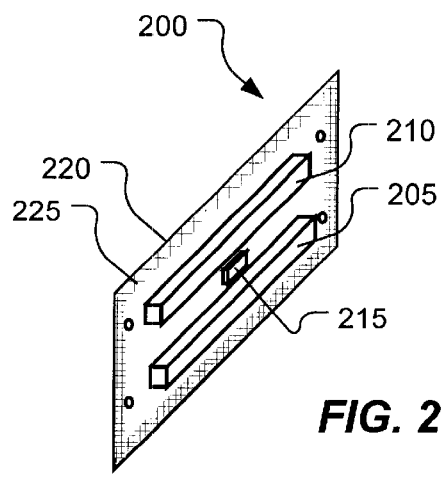
FIG. 1
FIG. 2

MODULAR COMPUTER SYSTEM MECHANICAL INTERCONNECTION

BACKGROUND OF THE INVENTION

1. Background of the Invention

This invention relates generally to expanding the capabilities of a computer system, and, more particularly, to interfacing an external module with a primary module of a computer system.

2. Description of the Related Art

Historically, computer systems are general purpose devices that may be modified to perform particular tasks or functions. Generally, computer systems include a motherboard mounted in a cabinet. The motherboard typically includes a number of connectors or slots in which special purpose printed circuit boards may be inserted. These special purpose printed circuit boards may be used to add to or enhance the functionality of the computer system. For example, a conventional computer system may have its graphics capability enhanced by the addition of a graphics card. Similarly, the sound-producing capability of the computer system may be enhanced by the addition of a sound card.

One limitation on the ability to add to or enhance the functionality of the computer system is the number of slots or connectors that are provided. For example, if a user desires to enhance both sound and graphics capability, but only a single slot or connector is available, then the user must select the more desirable function or alternate between the cards, as needed. Neither solution is particularly desirable.

In some computer systems, additional functionality is provided on the motherboard itself. That is, the motherboard may be designed with electrical leads or traces formed therein to provide interconnectivity to a special-purpose circuit. The integrated circuits used to perform the functionality of the special-purpose circuit may only be included on select motherboards where the customer has ordered the special-purpose circuit. Typically, this approach is used so that a manufacturer may design a single motherboard that is used in a variety of computer systems to achieve economies of scale in manufacturing the motherboard. However, the real estate on the motherboard is "wasted" in those computer systems that do not use the special purpose circuit. For example, it may be desirable to have additional microprocessors to provide a high-end computer system capable of performing more intense processing in some applications. Thus, the motherboard may be designed to accept multiple microprocessors, but only a single microprocessor is actually placed in the motherboard unless the customer requests additional microprocessors. Thus, in those systems in which only a single microprocessor is installed, valuable motherboard real estate is unused and performing no useful work for the computer system.

Some prior devices have suggested adding or enhancing functionality through an external connection to the computer system. This solution suffers from a variety of mechanical and electrical challenges, such as providing secure and high-quality electrical connections, difficulty of assembly, electromagnetic interference, cooling, and the like. Additionally, for these external or secondary devices to operate efficiently, they need to have a high-speed connection to the computer system, such as through a peripheral component interface (PCI) bus, an industry standard architecture (ISA) bus, a proprietary bus, a system bus, or the like. Extending a high-speed bus external to the cabinet of the computer system can create substantial difficulties. For example, a high-speed bus is sensitive to the length of the traces used to form the bus. Extending the bus will, of course, change the length of the traces, creating the potential for reflections and other interference anomalies on the extended bus. Further, timing difficulties may also arise from the extended distance that the signals must travel on the extended bus.

While minimizing the length of the high-speed bus extension is helpful in minimizing these electrical problems, it creates problems for physically connecting the components of the computer system to one another. For example, if the components to be interconnected are not physically aligned, a connection between the components may be impossible. If a connection can be physically accomplished, forces acting on the components due to misalignment may result in mechanical failure of one or more of the components, either immediately or at some future time. Such stress in these components can cause traces to crack and fail, solder joints to become loosened, and board-level devices to fail.

The present invention is directed to overcoming, or at least reducing the effects of, one or more of the problems set forth above.

SUMMARY OF THE INVENTION

In one aspect of the present invention, a modular computer system mechanical interconnection is provided. The apparatus includes a primary chassis having a first opening and a secondary chassis attached to the primary chassis and having a second opening, wherein the first opening and the second opening are generally aligned. The modular computer system further includes a backplate covering the aligned first opening and second opening.

In another aspect of the present invention, a modular computer system is provided. A modular computer system includes a primary chassis having a first opening, a motherboard disposed in the primary chassis, wherein the motherboard has an electrical connector disposed behind the first opening, and a secondary chassis attached to the primary chassis and having a second opening, wherein the first opening and the second opening are generally aligned. The modular computer system further includes an external device disposed in the secondary chassis, wherein the external device has an electrical connector disposed behind the second opening. Further, the system includes a bridgeboard having a first electrical connector interconnected with the motherboard electrical connector and a second electrical connector interconnected with the external device connector, wherein the bridgeboard is disposed within the aligned first opening and second opening, and a backplate covering the aligned first opening and second opening.

In yet another aspect of the present invention, an apparatus for electrically interconnecting a first device with a second device is provided. The apparatus includes a first connector, a flexible circuit electrically connected to the first device and the first connector, and a second connector electrically connected to the second device. The apparatus further includes a guide pin attached to a structure that is attached to the first device and a guide block having a recess therethrough and attached to the first connector, wherein the recess is adapted to receive the guide pin so that the guide block is capable of sliding along the guide pin.

In a further aspect of the present invention, an apparatus for electrically interconnecting a first device with a second device. The apparatus includes a first connector electrically connected to the first device, a second connector, and a connector board attached to and electrically connected to the second connector. The apparatus further includes a flexible circuit electrically connected to the second device and the connector board, a guide pin attached to a structure that is attached to the second device, and a guide block having a recess therethrough and attached to the connector board, wherein the recess is adapted to receive the guide pin so that the guide block is capable of sliding along the guide pin.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIG. 1 is a block diagram of an embodiment according to the present invention;

FIG. 2 is a stylized representation of a bridgeboard according to the present invention;

Figure 3:
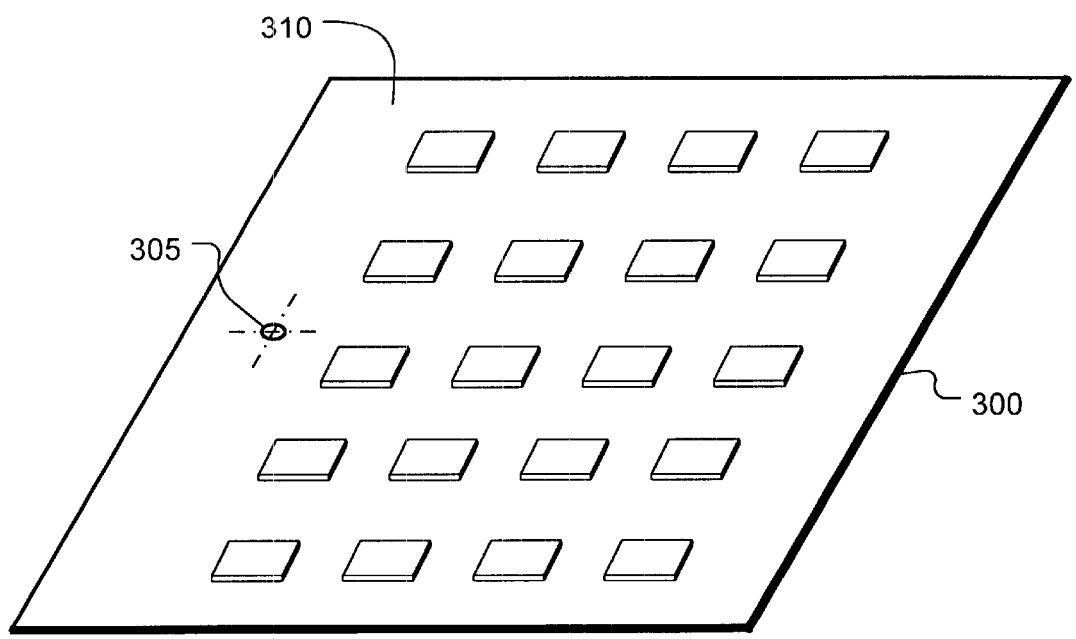
FIG. 3 is a stylized representation of a motherboard used in conjunction with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a computer system according to the present invention includes a primary device, e.g., a motherboard 100, contained within a primary chassis 105 and at least one external device 110 contained within a secondary chassis 115. Although only one external device 110 is shown in FIG. 1 and described herein, the scope of the present invention includes the use of any number of external devices 110. The high-speed bus of the motherboard 100 and the high-speed bus of the external device 110 are directly interconnected by a bus 120, which carries high-speed transmissions between the motherboard 100 and the external device 110. Thus, electrical signals carried on the bus of the motherboard 100 are transmitted to the bus of the external device 110, and the electrical signals carried on the bus of the external device 110 are transmitted to the bus of the motherboard 100. The motherboard 100 and the external device 110 may, however, communicate at different speeds or at relatively the same speed.

Such high-speed communications are highly affected by distances over which the communications must travel. Longer electrical paths or traces result in slower transmission times; conversely, shorter electrical paths result in faster transmission times. Further, various external devices, such as the external device 110, typically do not operate according to the same protocol as motherboards, such as the motherboard 100. The present invention addresses these problems by providing a bus 120 that is short, so as to minimize impact to communication speed, and that has a bridge chip 125 to electrically bridge between various communication speeds, protocols, and other environments. Thus, the external device 110 can be any desired device, e.g., storage media, a sound processor, a graphics processor, etc. Further, the external device 110 may communicate at any speed, faster or slower, relative to the motherboard 100 and may communicate with any protocol. Thus, the bridge chip 125 is capable of receiving signals from bus of the primary device (e.g., motherboard 100) and repeating the signals over the bus of the external device 110. Further, the bridge chip 125 is capable of receiving signals from the bus of the external device 110 and repeating the signals over the bus of the primary device (e.g., motherboard 100). The bridge chip 125 can receive the signals at a first transmission speed and retransmit them at a second transmission speed. Further, the bridge chip 125 can receive the signals under a first signal protocol and retransmit the signals under a second signal protocol. The bridge chip 125 creates a bridge between the environment of the motherboard 100 and the environment of the external device 110 without taxing performance of either the motherboard 100 or the external device 110.

Further, the primary chassis 105 and the secondary chassis 115 comprise aspects that minimize the possibility of electromagnetic waves from being radiated beyond the chassis 105, 115 from the electronic components therein. Such radiated waves can cause electromagnetic interference (EMI) in other devices. As it is possible for such electromagnetic waves to be radiated from the bus 120, one aspect of the present invention provides EMI shielding 130 for the bus 120.

The illustrated embodiment provides separate power supplies 135, 145 for providing power to each of the motherboard 100 and the external device 110, respectively. The illustrated embodiment further provides separate cooling devices 140, 150 for each of the primary chassis 105 and the secondary chassis 115, respectively. These cooling devices 140, 150 provide cooling to the motherboard 100 and the external device 110 and to other devices, if present, in the chassis 105, 115.

In one embodiment of the present invention, the motherboard 100 is connected to the external device 110 via a bridgeboard 200, which is shown in a stylized fashion in FIG. 2. Generally, the bridgeboard 200 may be a conventional printed circuit board with various electrical/electronic components and connectors mounted thereon. The bridgeboard 200 has a connector 205 that is connectible to the motherboard 100 and a connector 210 that is connectible to the external device 110. The connectors 205, 210 may be conventional edge connectors, or as discussed in more detail in conjunction with FIGS. 8A, 8B, 9, and 10 may include alignment mechanisms to facilitate positioning and coupling the bridgeboard 200 with the external device 110 and/or the motherboard 100. The bridgeboard 200 also comprises electrical connections (not shown) from the connector 205 to the connector 210 through a bridge chip 215. The electrical connections may take the form of conventional tracings formed in a printed circuit board. While the present embodiment discloses the bridge chip 125, the functionality of the bridge chip 125 may be implemented in a plurality of chips in any suitable configuration. As presented previously, the bridge chip 215 creates a bridge between the environment of the motherboard 100 and the environment of the external device 110 without taxing performance of either the motherboard 100 or the external device 110. The bridgeboard 200 further includes an electrically-conductive backplate 220 and an EMI-shielding gasket 225 to protect the components in the chassis from the elements and for containing EMI. The backplate 220 may be integrally formed with the bridgeboard 200 or may be separately formed and attached thereto. Generally, the backplate 220 is formed from a metal layer, such as aluminum, copper, titanium, or the like. The bridgeboard 200 further comprises other elements, both electrical and mechanical, as required for efficient communication between the motherboard 100 and the external device 110.

As will be appreciated by one skilled in the art, it is desirable for the motherboard 100 and the external device 110 to be aligned such that, when they are interconnected with the bridgeboard 200, a minimum amount of stress is applied to the interconnections between the motherboard 100, the bridgeboard 200, and the external device 110. One aspect of the present invention addresses this situation by precisely locating the external device 110 with respect to the motherboard 100 and by providing an adaptable connection between the bridgeboard 200 and the external device 110. It is within the scope of the present invention, however, to provide an adaptable connection between either the motherboard 100 and the bridgeboard 200, between the bridgeboard 200 and the external device 110, or both.

Figure 4:
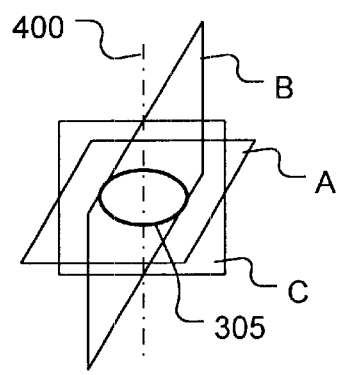
FIG. 4 illustrates a datum structure for the motherboard shown in FIG. 3.

Various industry standards (e.g., the multi-company WTX standard and the Intel® ATX standard) specify a datum structure for placement of electronic and mechanical components within a chassis based upon a hole in the motherboard (known as the 0,0 hole) and a surface of the motherboard. Referring now to FIG. 3, such a motherboard 300 is shown having a hole 305 and a top surface 310. In this example, all other components in the chassis are placed in reference to the hole 305 and the top surface 310 of the motherboard 300. FIG. 4 illustrates this datum structure. The top surface 310 of the motherboard 300 corresponds to datum plane A. A plane perpendicular to datum plane A and containing a centerline 400 of the hole 305 is datum plane B. A plane perpendicular to datum plane B and containing the centerline 400 of the hole 305 is datum plane C. Locating other components within the chassis with respect to the datum planes A, B, and C fully describe the location and orientation of the other components in six degrees of freedom.

The present invention interconnects at least two electronic components in at least two chassis. Not only is it desirable for the two chassis (and thus the two electronic components) to have a fixed relationship between each other, but it is desirable for the two chassis (and thus the two electronic components) to be in a particular relationship to one another, so that the motherboard 100 and external device 110 can physically be interconnected with the bridgeboard 200 and so that a minimum amount of stress is placed upon the bridgeboard 200 when it is interconnected with the motherboard 100 and the external device 110.

Figure 5:
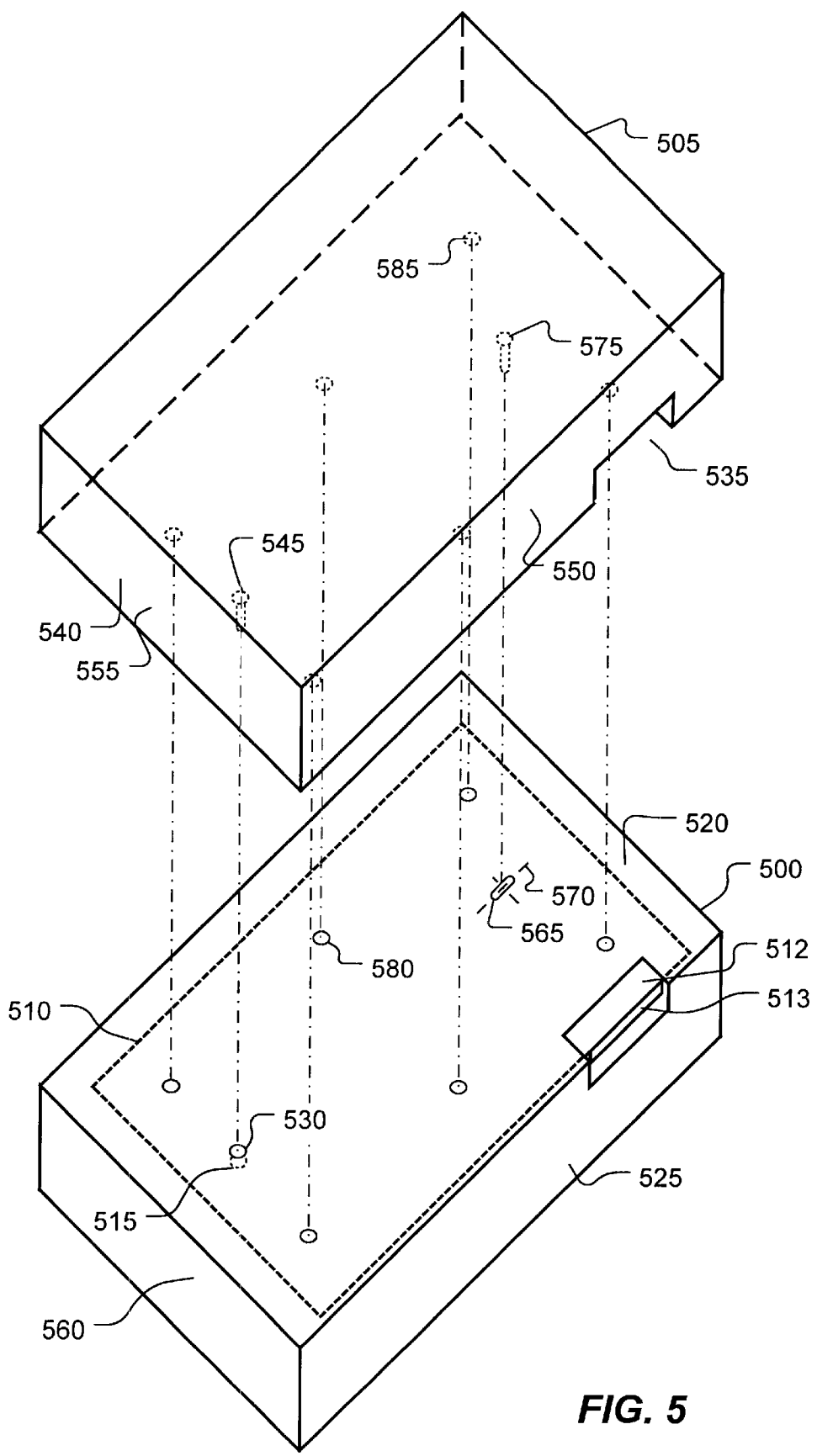
FIG. 5 is an exploded perspective view of a computer system according to the present invention.

With this in mind, attention is drawn to FIG. 5, which illustrates an embodiment of the present invention having a fixed-position motherboard 510, a rigid bridgeboard 200 that is positioned based upon the location of the motherboard 510, and an external device 700 (FIG. 7) that is positioned based upon the location of the bridgeboard 200. A primary chassis 500 has installed therein the motherboard 510 and corresponds to a populated chassis assembly. The primary chassis 500 has an opening 512 so that a connector 513 on the motherboard 500 is exposed. The motherboard 510 has a datum hole 515, which corresponds to the 0,0 hole of the specifications referenced above. The motherboard 510 is located at a known location within the primary chassis 500. The motherboard 510 specifically has a known positional relationship to a side wall 520 and a lower wall 525 of the primary chassis 500. In the illustrated embodiment, the datum hole 515 is mimicked or replicated in the side wall 520 of the primary chassis 500 as hole 530. Thus, the hole 530 has a known relationship with respect to the side wall 520 and the lower wall 525.

A secondary chassis 505 has an opening 535 formed in a lower wall 550. The secondary chassis 505 also has a pin 545 extending from the side wall 540 in a location corresponding to the hole 530. In other words, the pin 545 is the same distance from the lower wall 550 as the hole 530 is from the lower wall 525. Further, the pin 545 is the same distance from an end wall 555 as the hole 530 is from an end wall 560. Thus, the pin 545 is in a location that is a mirror image to that of the hole 530. The diameter of the hole 530 is slightly larger than the diameter of the pin 545 such that the pin 545 has a close, sliding fit into the hole 530.

With the pin 545 inserted into the hole 530, and with the side wall 540 against the side wall 520, the secondary chassis 505 is located with respect to the primary chassis 500 in five of the six degrees of freedom: the secondary chassis 505 can rotate about a centerline through the pin 545 and the hole 530. To constrain this final degree of freedom, a slot 565 is provided in the side wall 520 of the primary chassis 500. A major axis 570 of the slot 565 is aligned such that, when extended, it passes through the center of the hole 530. A pin 575 is provided in the side wall 540 of the secondary chassis 505, such that when the pin 545 is inserted into the hole 530 and the side wall 540 is adjacent the side wall 520, the pin 575 can inserted into the slot 565, resulting in the primary chassis 500 being generally aligned with the secondary chassis 505. The minor dimension of the slot (perpendicular to the major axis 570) is only slightly larger than the diameter of the pin 575 such that the pin has a close, sliding fit into the slot 565. The pin 575 can, in an alternate embodiment, be a fastener so that, when installed, the side wall 540 is held against the side wall 520. In the illustrated embodiment, the slot 565 is elongated, rather than round, to accommodate tolerance buildups in the manufacturing process. Holes 580 (only one labeled) in the side wall 520 of the primary chassis 500 and holes 585 (only one labeled) in the side wall 540 of the secondary chassis 505 are provided so that fasteners (not shown) can be inserted therethrough for attaching the primary chassis 500 to the secondary chassis 505. Thus, the secondary chassis 505 is located in a predetermined relationship to the motherboard 510.

Figure 6:
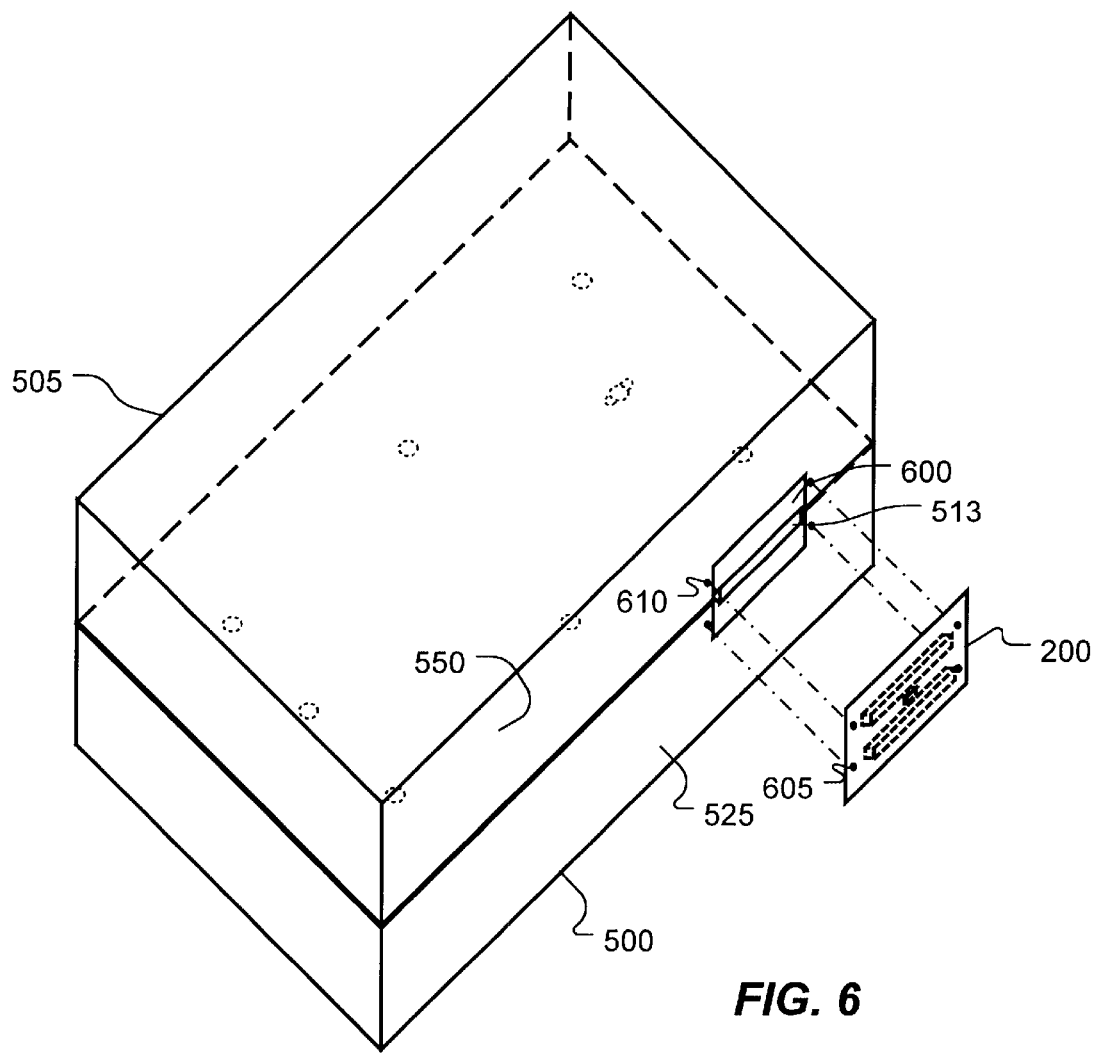
FIG. 6 is a perspective view of the computer system shown in FIG. 5.

With the primary chassis 500 attached to the secondary chassis 505, as discussed above and illustrated in FIG. 6, the openings 512 and 535 (shown in FIG. 5) are generally aligned to form an opening 600 into the chassis 500 and 505. The connector 513 of the motherboard 510 (FIG. 5) is exposed. The bridgeboard 200 can now be installed onto the connector 513, which defines the location of the bridgeboard 200. The bridgeboard 200 is provided with oversized holes 605 (only one labeled) so that the bridgeboard can be attached to the lower wall 525 of the primary chassis 500 and the lower wall 550 of the secondary chassis 505 via fasteners (not shown) through holes 610 (only one labeled) in the lower wall 525 and the lower wall 550. The holes 605 are oversized so that the bridgeboard 200 can be installed under a minimum installation stress. In other words, the bridgeboard 200 can be installed so that the connector 205 (FIG. 2) on the bridgeboard 200 can be connected with the connector 513 (FIG. 5) on the motherboard 510 without creating unacceptable stress in either the motherboard 510 or the bridgeboard 200. The bridgeboard 200 can be attached to-the primary and secondary chassis 500 and 505 by any desired way suitable for the application, such as with screws, nuts and bolts, rivets, push-through connectors, and the like with the bridgeboard 200 thus installed, the primary and secondary chassis 500 and 505, in combination with the backplate 220 (FIG. 2) and the EMI-shielding gasket 225 (FIG. 2) of the bridgeboard 200, provide a barrier against emissions of electromagnetic waves from the computer system.

Figure 7:
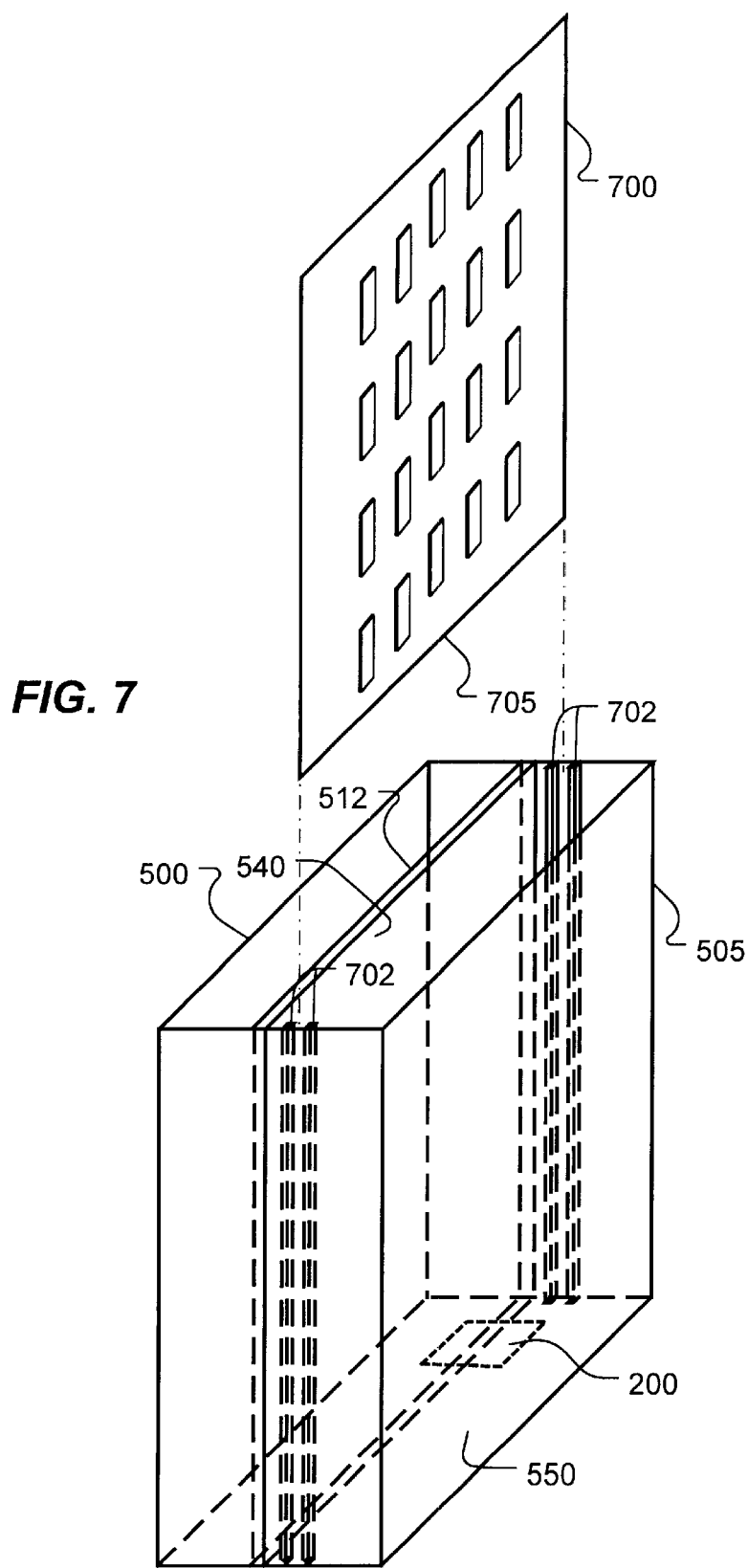
FIG. 7 is a perspective view of the computer system shown in FIGS. 5 and 6.
Figure 8A:
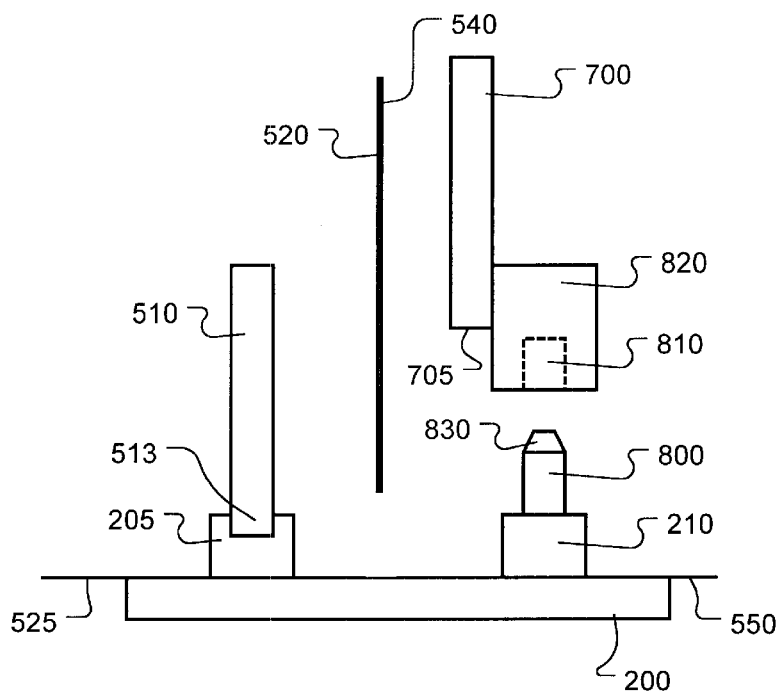
FIGS. 8A and 8B illustrate representations of the motherboard and external device interconnections with the bridgeboard according to an embodiment of the present invention.
Figure 8B:
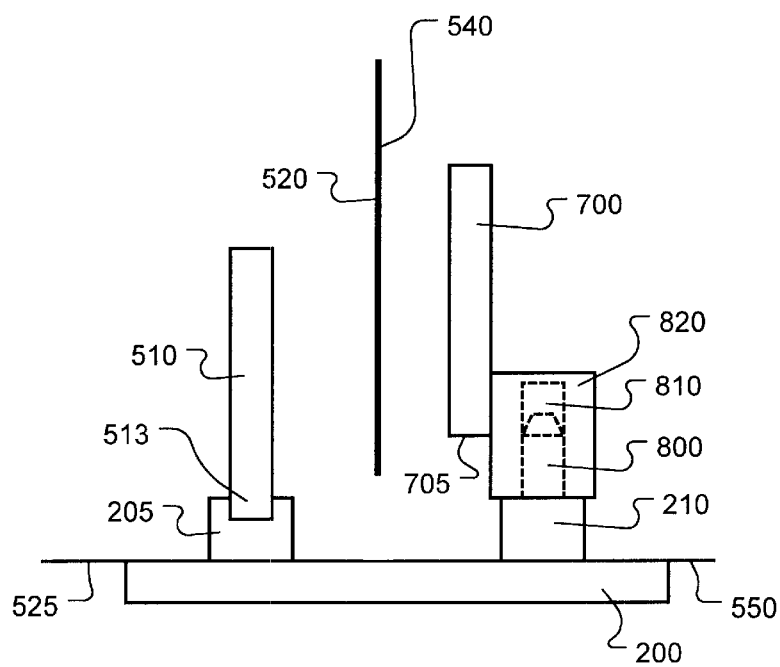

Turning now to FIG. 7, the external device 700 can now be installed into an interior portion of the secondary chassis 505 and interconnected with the bridgeboard 200. As it is being installed, the external device 700 is guided along rails 702 on the inside of the secondary chassis 505. The rails 702 are positioned with respect to the side wall 540 of the secondary chassis 505, which sets a spacing from the connector 820 (FIG. 8) on the external device to the connector 210 (FIGS. 2, 8) on the bridgeboard 200 when the connectors 820, 210 are connected. The external device 700 is not precisely located by the rails 702 but rather is allowed to "float" to a degree between the rails 702. For example, the distance between adjacent rails 702 may be greater than the thickness of the external device 700, thereby allowing the external device 700 to move from side-to-side between adjacent rails 702. In other words, adjacent rails 702 do not firmly or rigidly hold the external device 700 but rather guide its location within a fixed dimension. Now with attention to FIG. 8A, as a leading edge 705 of the external device 700 nears the connector 210, a locating pin 800 on the connector 210 enters a corresponding opening 810 in a locating block 820 attached to the external device 700. The pin 800 has a chamfered portion 830 to assist in guiding the pin 800 into the opening 810. Thus, as the locating pin 800 enters the opening 810 (FIG. 8B), the external device 700 is located with respect to the connector 210, and the external device 700 can be interconnected with the bridgeboard 200 with little remaining stress on the bridgeboard 200 or the external device 700. The external device 700 can now be rigidly affixed to the secondary chassis 505.

In one embodiment of the present invention, a method of datum sharing is provided including determining a position and orientation of the motherboard 300, 510 and defining at least one datum feature in the primary chassis 500 describing the position and orientation of the motherboard 300, 510. In one embodiment, the position and orientation of the motherboard 300, 510 is determined by determining the first plane A (FIG. 4) corresponding to the surface 310 of the motherboard 300, 510, a second plane B (FIG. 4) perpendicular to the surface 310 of the motherboard 300, 510 having a center of the hole 310, 515 in the motherboard 300 thereon, and a third plane C (FIG. 4) perpendicular to the second plane B and having the center of the hole 310, 515 in the motherboard 300 thereon. In one embodiment, defining at least one datum feature in the primary chassis 500 further comprises defining a wall 520 in the primary chassis 500 parallel to the first plane A, defining a hole 530 in the wall 520 having a center corresponding the center of the hole 305, 515 in the motherboard, and defining a slot 565 in the wall 520, wherein a major axis 570 of the slot 565 lies on the second plane B. The method further comprises defining at least one datum feature in the secondary chassis 505 corresponding to the at least one datum feature in the primary chassis 500. In one embodiment, defining at least one datum feature in the secondary chassis 505 further comprises defining a wall 540 in the secondary chassis 505 parallel to the wall 520 of the primary chassis, defining a pin 545 extending outwardly from the wall 540 corresponding to the hole 530 in the wall 520 of the primary chassis 500, and defining a pin 575 extending outwardly from the wall 540 corresponding to the slot 565 in the wall 520 of the primary chassis 500. Alternatively, the pin 575 may be a fastener.

In another embodiment, a method for datum sharing is provided including defining the datum structure for the motherboard 510 and transferring the datum structure to the primary chassis 500 to define a relationship between a location and orientation of the motherboard 510 and a location and orientation of the primary chassis 500. Further, the method includes transferring the datum structure to the secondary chassis 505 to define a relationship between the location and orientation of the primary chassis 500 and the location and orientation of the secondary chassis 505. In one embodiment, the method further comprises locating an external device 700 in the secondary chassis 505 based upon the datum structure transferred to the secondary chassis 505.

Figure 9:
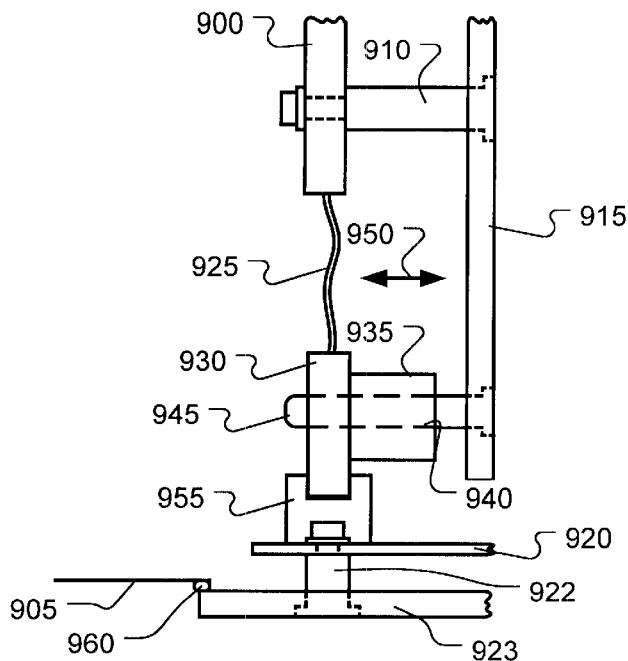
FIG. 9 illustrates representations of the motherboard interconnection with the bridgeboard according to another embodiment of the present invention.

FIG. 9 illustrates an embodiment of the present invention in which a main portion 900 of a device (corresponding to either a motherboard or an external device) is in a fixed relationship to the chassis 905 via one or more standoffs 910 (one shown) attached to a side wall 915 of the chassis 905. Further, the bridgeboard 920 is in a fixed relationship to the chassis 905 and is attached via standoffs 922 (one shown) to the backplate 923. The main portion 900 is electrically interconnected via a flexible circuit 925, containing electrical conductors for each of the lines to be connected, to an electrical connector 930. The electrical connector 930 can be a conventional edge connector or any other type of connector suitable for the application. Attached to the electrical connector 930 is a guide block 935 that may be made of any suitable material, e.g., Teflon™, Delrin™, or the like. The guide block 935 has a recess 940 therethrough that is adapted to slidably receive a guide pin 945, which is affixed to the side wall 915 of the chassis 905. Thus, in this embodiment, the connector 930 and the guide block 935 are capable of moving as indicated by double-headed arrow 950. Accordingly, the connector 930 and the guide block 935 move, as indicated by the double-headed arrow 950, to seek the lowest-stress condition as the connector 930 is interconnected with the connector 955. Further, in this embodiment, a gasket 960 is provided for sealing from the elements and for EMI containment.

Figure 10:
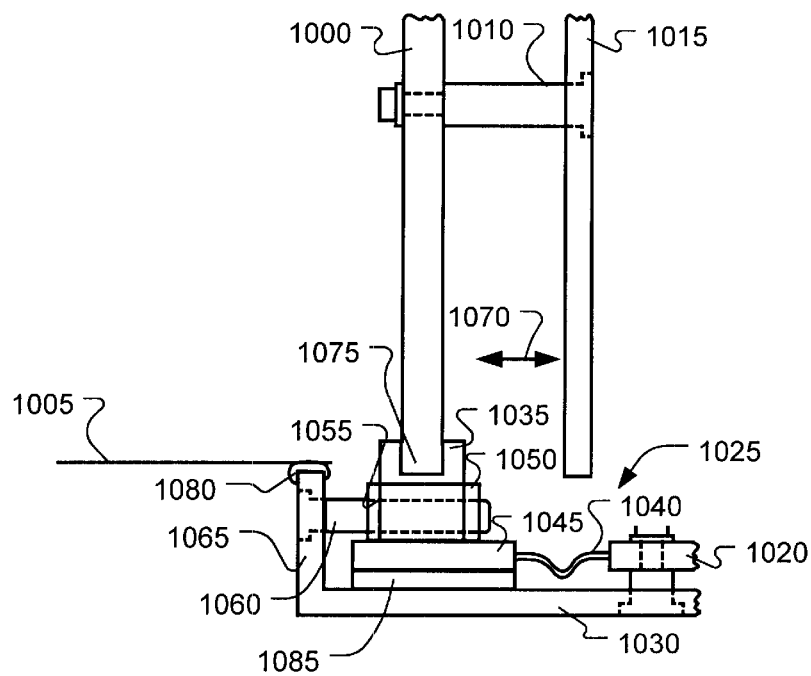
FIG. 10 illustrates representations of the motherboard interconnection with the bridgeboard according to a further embodiment of the present invention.

In the embodiment illustrated in FIG. 10, a device 1000 (corresponding to either a motherboard or an external device) is in a fixed relationship with the chassis 1005 via a standoff 1010 that is attached to a side wall 1015 of the chassis 1005. A main portion 1020 of the bridgeboard 1025, as well as a backplate 1030 attached to the bridgeboard 1025, is in a fixed relationship to the chassis 1005. The main portion 1020 is electrically attached to a connector 1035 via a flexible circuit 1040, containing electrical conductors for each of the lines to be connected, and a connector board 1045. The connector 1035 is physically attached to the connector board 1045, as is a guide block 1050 that may be made of any suitable material, e.g., Teflon™, Delrin™, or the like. The guide block 1050 has a recess 1055 therethrough that is adapted to receive a guide pin 1060, which is attached to a wall 1065 of the backplate 1030. The guide pin 1060 thus guides the guide block 1050, the connector board 1045, and the connector 1035 in a direction corresponding to the double-headed arrow 1070. Thus, the guide block 1050, the connector board 1045, and the connector 1035 move in a direction corresponding to the double-headed arrow 1070 to seek the lowest stress condition as a connector portion 1075 of the device 1015 is mated with the connector 1035. Further, in this embodiment, a gasket 1080 is provided for sealing from the elements and for EMI containment. The illustrated embodiment also provides a stop block 1085 to provide support for the connector plate 1045.

The scope of the present invention includes any of the embodiments illustrated in FIGS. 8A, 8B, 9, and 10 used in any combination on either or both of the primary device or motherboard and the external device.

Referring again to FIGS. 5–8B, the computer system according to the illustrated embodiment is assembled by first attaching the motherboard 510 to an interior portion of the primary chassis 500. The primary chassis 500 is positioned such that the side wall 520 is facing up and the secondary chassis 505 is placed onto the primary chassis 500 such that the pin 545 enters the hole 530 and the pin 575 enters the slot 565. Thus, the secondary chassis 505 is generally aligned with the primary chassis and the openings 512 and 535 are generally aligned. Fasteners (not shown) are installed through the holes 580 and 585 (only one of each labeled) to hold the two chassis 500 and 505 together. The bridgeboard 200 is installed such that the connector 205 is mated with the motherboard connector 513 and the bridgeboard 200 is attached to the primary chassis 500 and the secondary chassis 505. The bridgeboard 200 is attached to at least one of the primary chassis 500 and the secondary chassis 505 to position the bridgeboard 200 and to shield the openings 512 and 535 to inhibit electromagnetic waves from escaping from the interior portion of the primary chassis 500 and the secondary chassis 505. The assembly is then rotated such that the bridgeboard 200 is on the bottom and the external device 700 is installed. The external device 700 is guided along the rails 702 and is located with respect to the connector 210 on the bridgeboard 200 by the locating pin 800 and the opening 810. As the external device 700 is located, it is both physically and electrically interconnected with the connector 210 on the bridgeboard 200. The external device 700 can now be rigidly affixed to the secondary chassis 505. Thus, when the secondary chassis 505 is attached to the primary chassis 500 and the external device 700 is installed, the external device 700 is located in a predetermined relationship to the motherboard 510 and in a predetermined volume in the interior portion of the secondary chassis 505.

In the embodiments illustrated in FIGS. 9 and 10, the primary chassis 500 and the secondary chassis 505 (FIG. 5) may be attached to one another and populated in any desired order, as the interconnection between the bridgeboard 920, 1025 and the device 900, 1000 is made via the flexible circuit 925, 1040. In one embodiment, the secondary chassis 505 is attached to the primary chassis 500 (FIG. 5). Referring in particular to FIG. 9, the main portion 900 of the device is attached to the interior portion of the side wall 915 of the chassis 905. The position of the electrical connector 930 is adjusted to generally align the electrical connector 930 and the electrical connector 955 before electrical connector 930 and the electrical connector 955 are connected. In the illustrated embodiment, the main portion 900 and connector 930 can be that of the motherboard 510 (FIG. 5) or the external device 700 (FIG. 7). Referring now to FIG. 10, the device 1000 is attached to the interior portion of the side wall 1015 of the chassis 1005. The position of the electrical connector 1035 is adjusted to generally align the connector 1075 with the connector 1035 before electrical connector 1075 and the electrical connector 1035 are connected. In the illustrated embodiment, the connector 1035 can be the connector 205 or the connector 210 on the bridgeboard 200 (FIG. 2) that mates with the connector 513 of the motherboard 510 (FIG. 5) or the connector 820 of the external device 700 (FIG. 8).

The present invention further encompasses an apparatus having means for performing certain embodiments of the method of the invention described herein and their equivalents.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed is:

1. A modular computer system, comprising:
   a primary chassis having a first opening;
   a motherboard disposed in the primary chassis, wherein the motherboard has an electrical connector disposed behind the first opening;
   a secondary chassis attached to the primary chassis and having a second opening, wherein the first opening and the second opening are generally aligned;
   an external device disposed in the secondary chassis, wherein the external device has an electrical connector disposed behind the second opening;
   a bridgeboard having a first electrical connector interconnected with the motherboard electrical connector and a second electrical connector interconnected with the external device connector, wherein the bridgeboard is disposed within the first opening and second opening; and
   a backplate covering the first opening and second opening.

2. A modular computer system, according to claim 1, wherein the backplate is made of an electrically conductive material.

3. A modular computer system, according to claim 1, wherein the backplate is integral with the bridgeboard.

4. A modular computer system, according to claim 1, wherein the bridgeboard is attached to the backplate.

5. A modular computer system, according to claim 1, wherein the motherboard is located in a predetermined position in the primary chassis.

6. A modular computer system, according to claim 1, wherein a location of the bridgeboard with respect to the primary chassis and the secondary chassis is determined by a location of the motherboard in the primary chassis.

7. A modular computer system, according to claim 3, wherein a location of the external device in the secondary chassis is determined by the location of the bridgeboard.

8. A modular computer system, according to claim 1, further comprising a gasket between the backplate and the primary chassis and between the backplate and the secondary chassis.

9. A modular computer system, according to claim 1, wherein the backplate is attachable to the primary chassis and the secondary chassis based upon a location of the motherboard in the primary chassis.

10. A modular computer system, according to claim 1, wherein the primary chassis has at least one attachment hole, the secondary chassis has at least one attachment hole, and the backplate has at least two attachment holes, wherein the attachment holes are for receiving fasteners therethrough to attach the backplate to the primary chassis and the secondary chassis, wherein the at least two attachment holes in the backplate are larger than the at least one hole in the primary chassis and the at least one hole in the secondary chassis.

11. A modular computer system, according to claim 1, wherein each of the primary chassis and the secondary chassis have a plurality of attachment holes therethrough for receiving fasteners therethough to attach the primary chassis to the secondary chassis.

12. A modular computer system, according to claim 1, further comprising a plurality of rails in the secondary chassis for guiding the location of the external device within a predetermined volume.

13. A modular computer system, according to claim 12, wherein the plurality of rails are sufficiently spaced to allow the external device to move side-to-side between adjacent rails.

14. A modular computer system, according to claim 1, wherein the bridgeboard further comprises a locating pin and the external device further comprises a locating block having a recess therein adapted to receive the locating pin.

15. A modular computer system, according to claim 14, wherein the locating pin has a chamfered portion to assist in guiding the locating pin into the recess.

16. A modular computer system, according to claim 1, wherein the motherboard further comprises a main portion and a flexible circuit interconnecting the main portion and the motherboard electrical connector, the modular computer system further comprising:

a guide pin attached to the primary chassis; and a guide block having a recess therethrough and attached to the motherboard electrical connector, wherein the recess is adapted to receive the guide pin so that the guide block is capable of sliding along the guide pin.

17. A modular computer system, according to claim 1, wherein the external device further comprises a main portion and a flexible circuit interconnecting the main portion and the external device electrical connector, the modular computer system further comprising:

a guide pin attached to the primary chassis; and a guide block having a recess therethrough and attached to the motherboard electrical connector, wherein the recess is adapted to receive the guide pin so that the guide block is capable of sliding along the guide pin.

18. A modular computer system, according to claim 1, wherein the bridgeboard further comprises a main portion, a connector board, and a flexible circuit, wherein the main portion and the connector board are interconnected via the flexible circuit and the first connector is electrically connected to the connector board, the modular computer system further comprising:

a guide pin attached to the secondary chassis; and a guide block having a recess therethrough and attached to the connector board, wherein the recess is adapted to receive the guide pin so that the guide block is capable of sliding along the guide pin.

19. A modular computer system, according to claim 18, further comprising a stop block disposed between the connector board and the backplate and attached to the backplate to support the connector board, wherein the connector board is capable of sliding along a surface of the stop block.

20. A modular computer system, according to claim 1, wherein the bridgeboard further comprises a main portion, a connector board, and a flexible circuit, wherein the main portion and the connector board are interconnected via the flexible circuit and the second connector is electrically connected to the connector board, the modular computer system further comprising:

a guide pin attached to the secondary chassis; and a guide block having a recess therethrough and attached to the connector board, wherein the recess is adapted to receive the guide pin so that the guide block is capable of sliding along the guide pin.

21. A modular computer system, according to claim 20, further comprising a stop block disposed between the connector board and the backplate and attached to the backplate to support the connector board, wherein the connector board is capable of sliding along a surface of the stop block.

\* \* \* \* \*